United States Patent
Jetton

(10) Patent No.: US 9,867,317 B1
(45) Date of Patent: Jan. 9, 2018

(54) HEAT SINK WITH MOUNTED POWER SUPPLY

(71) Applicant: Juniper Networks, Inc., Sunnyvale, CA (US)

(72) Inventor: Thomas W. Jetton, Sunnyvale, CA (US)

(73) Assignee: Juniper Networks, Inc., Sunnyvale, CA (US)

(*) Notice: Subject to any disclaimer, the term of this patent is extended or adjusted under 35 U.S.C. 154(b) by 0 days.

(21) Appl. No.: 15/244,422

(22) Filed: Aug. 23, 2016

(51) Int. Cl.
*H05K 7/20* (2006.01)
*H05K 1/02* (2006.01)

(52) U.S. Cl.
CPC ....... *H05K 7/20445* (2013.01); *H05K 1/0203* (2013.01); *H05K 7/209* (2013.01); *H05K 7/2039* (2013.01); *H05K 2201/066* (2013.01)

(58) Field of Classification Search
CPC .. H05K 7/20445; H05K 7/209; H05K 1/0203; H05K 2201/066
See application file for complete search history.

(56) References Cited

U.S. PATENT DOCUMENTS

| | | | |
|---|---|---|---|
| 9,627,864 B2* | 4/2017 | Sliech | H01Q 21/0087 |
| 2012/0307484 A1* | 12/2012 | Lin | F21V 19/045 |
| | | | 362/184 |
| 2015/0214642 A1* | 7/2015 | Majcher | H05K 7/20927 |
| | | | 439/65 |

* cited by examiner

*Primary Examiner* — Robert J Hoffberg
*Assistant Examiner* — Matt Dhillon
(74) *Attorney, Agent, or Firm* — Harrity & Harrity, LLP

(57) ABSTRACT

An apparatus may include a heat sink to be mounted to a printed circuit board. The apparatus may include a power supply mounted to the heat sink. The power supply may receive input power and supply output power to one or more components of the printed circuit board.

20 Claims, 5 Drawing Sheets

HEAT SINK WITH MOUNTED POWER SUPPLY

BACKGROUND

A heat sink is a passive heat exchanger that transfers the heat generated by an electronic or a mechanical device to a fluid medium, often air or a liquid coolant, where the heat is dissipated away from the device, thereby regulating (e.g., reducing) the device's temperature. In computing devices, heat sinks are used to cool various components, such as central processing units or graphics processors. A heat sink may be used with a semiconductor device, such as a power transistor, an optoelectronic device, a laser, or a light emitting diode (LED), where the heat dissipation ability of the semiconductor device is insufficient to moderate the semiconductor device's temperature.

SUMMARY

According to some possible implementations, an apparatus may include a heat sink to be mounted to a printed circuit board. The apparatus may include a power supply mounted to the heat sink. The power supply may receive input power and supply output power to one or more components of the printed circuit board.

According to some possible implementations, a heat sink may be mounted to a printed circuit board using a plurality of conductive fasteners. The heat sink may include a fin area that includes one or more fins to dissipate heat, and a fin-free area for mounting a power supply to the heat sink. The power supply may receive input power via a first conductive fastener of the plurality of conductive fasteners, and may supply output power, to one or more components of the printed circuit board, via a second conductive fastener of the plurality of conductive fasteners.

According to some possible implementations, a device may include a heat sink, a first conductive fastener to mount the heat sink to a printed circuit board, a second conductive fastener to mount the heat sink to the printed circuit board, and a power supply, mounted to the heat sink, to receive input power via the first conductive fastener and supply output power via the second conductive fastener.

DETAILED DESCRIPTION

The following detailed description of example implementations refers to the accompanying drawings. The same reference numbers in different drawings may identify the same or similar elements.

Printed circuit boards (PCBs) may include many components (e.g., electrical components), such as power supplies (e.g., power converters), processors, application specific integrated circuits (ASICs), field programmable gate arrays (FPGAs), busses, or the like. The complexity and operational requirements for PCBs can reduce the space available to place these components, and connections between the components, on the PCB. Due to these space constraints, the design of PCBs can be extremely complex and expensive, leading to greater design time and greater design cost and PCB cost. For example, a router or another type of network device may include twenty, thirty, or more power supplies to supply power to PCB components (e.g., to convert input power to the appropriate voltage for different components). These power supplies also require holes (e.g., input pins or output pins) in the PCB to receive input power and supply output power, which further increases design difficulty and may result in an increased number of PCB routing layers. Also, high-power consumption devices may require the use of relatively more voltage paths or rails, and each separate voltage path requires a dedicated power supply source for operation, further reducing the available space on the PCB.

Implementations described herein include a power supply mounted to a heat sink (e.g., on top of a base of the heat sink). These implementations increase the space available on a PCB because power supplies that would otherwise be mounted directly on the PCB may be mounted to the heat sink. Further, these implementations may reduce complexity of PCB design because the surface of the PCB may no longer need to be designed to accommodate power supplies. Further, providing a power supply on top of a base of the heat sink may provide a more direct route from the power supply to components located directly below the heat sinks, thereby further increasing PCB space and reducing complexity. Also, more accurate voltage can be provided to components due to nearby proximity of the power supply and the components.

Figure 1:
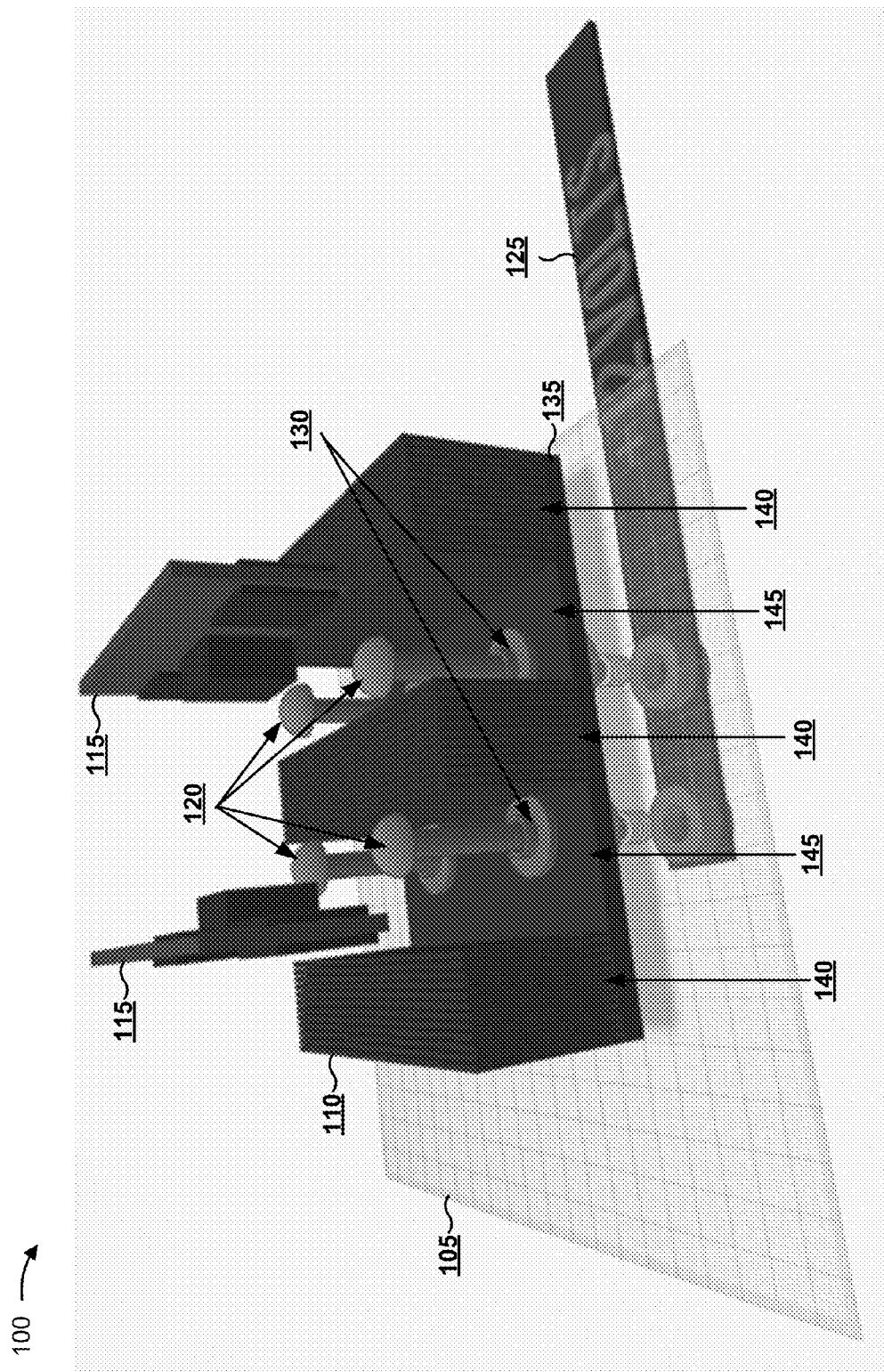
FIGS. 1-5 are diagrams of an example apparatus that includes a heat sink with a mounted power supply.
Figure 2:
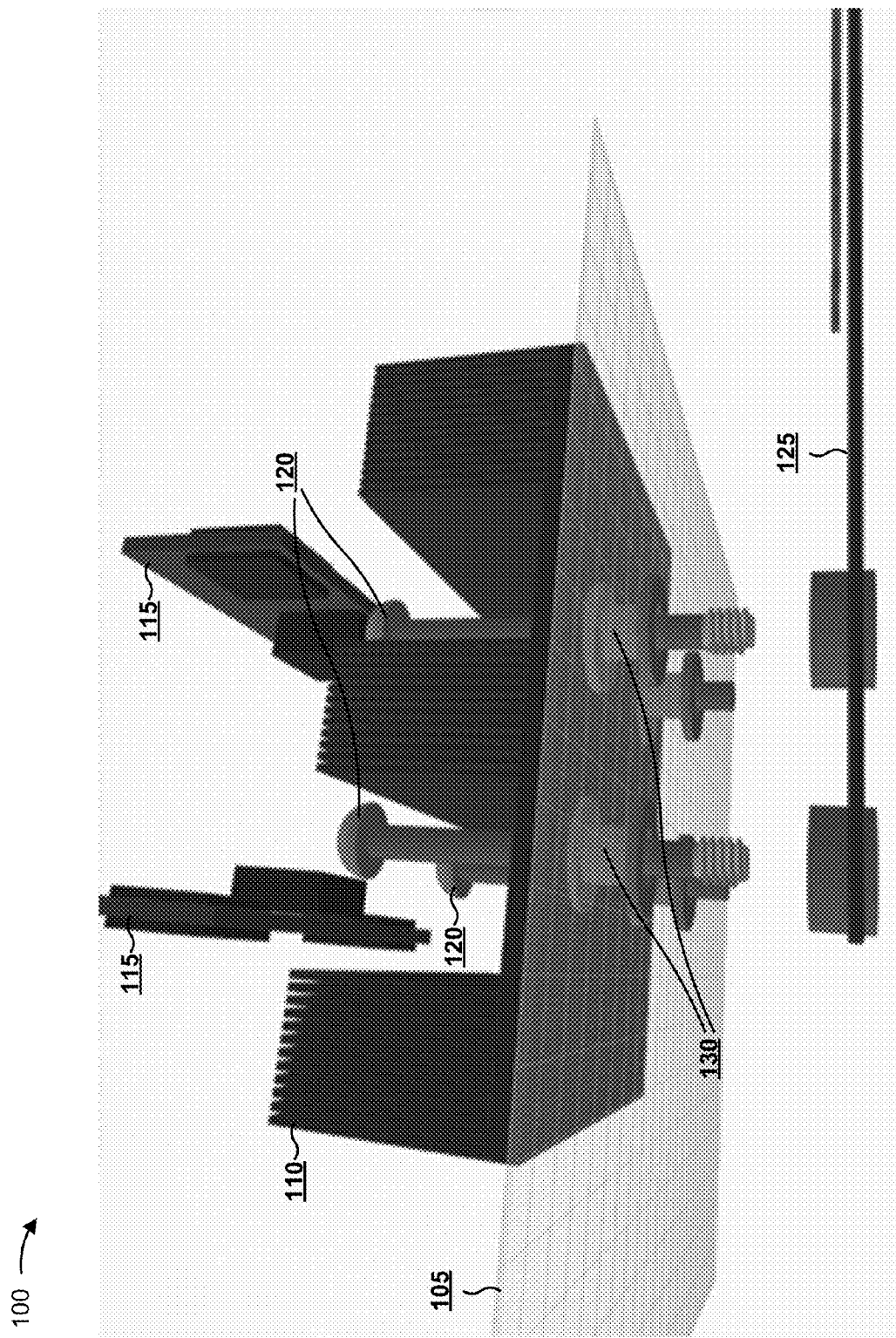
Figure 3:
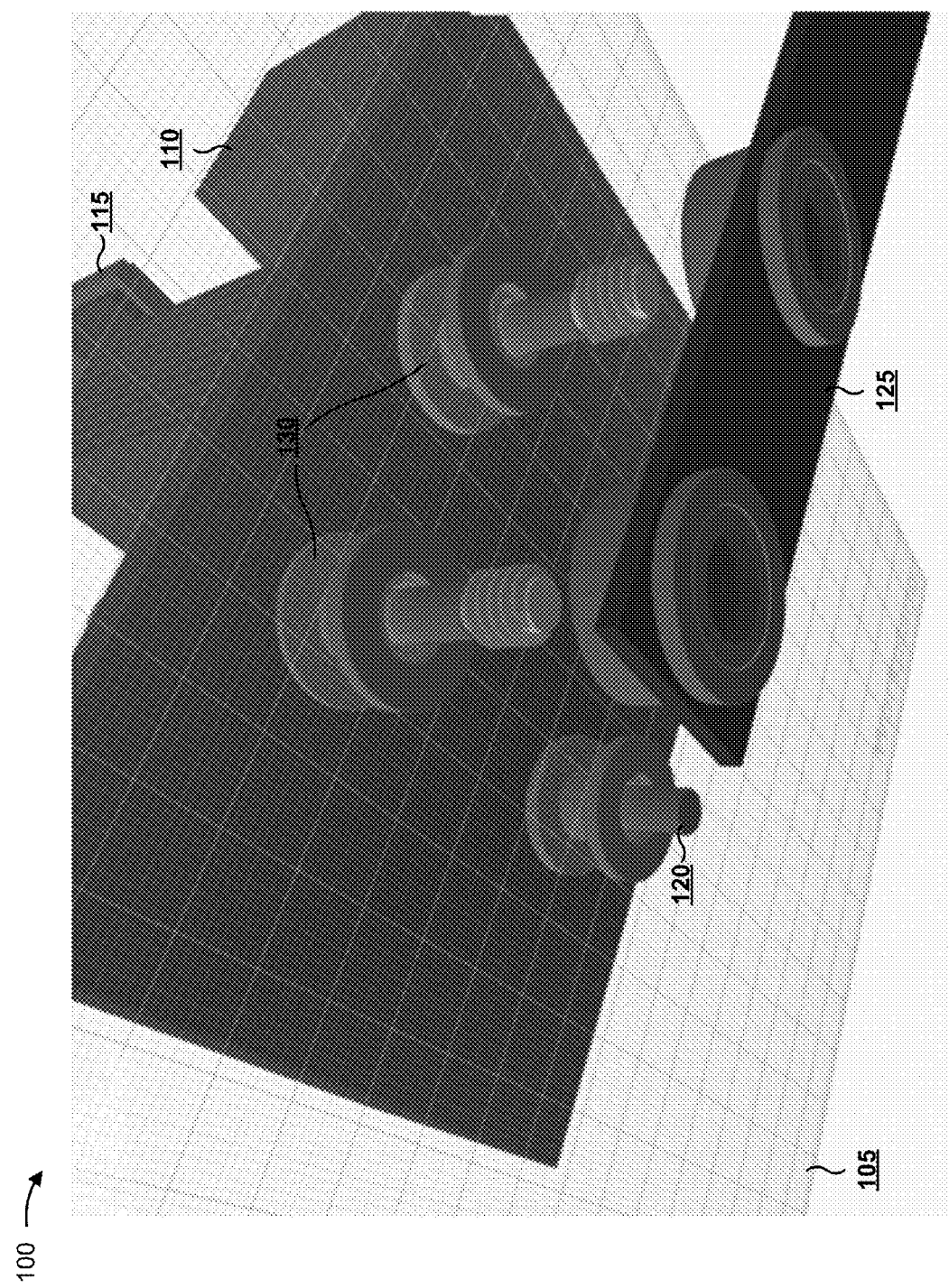
Figure 4:
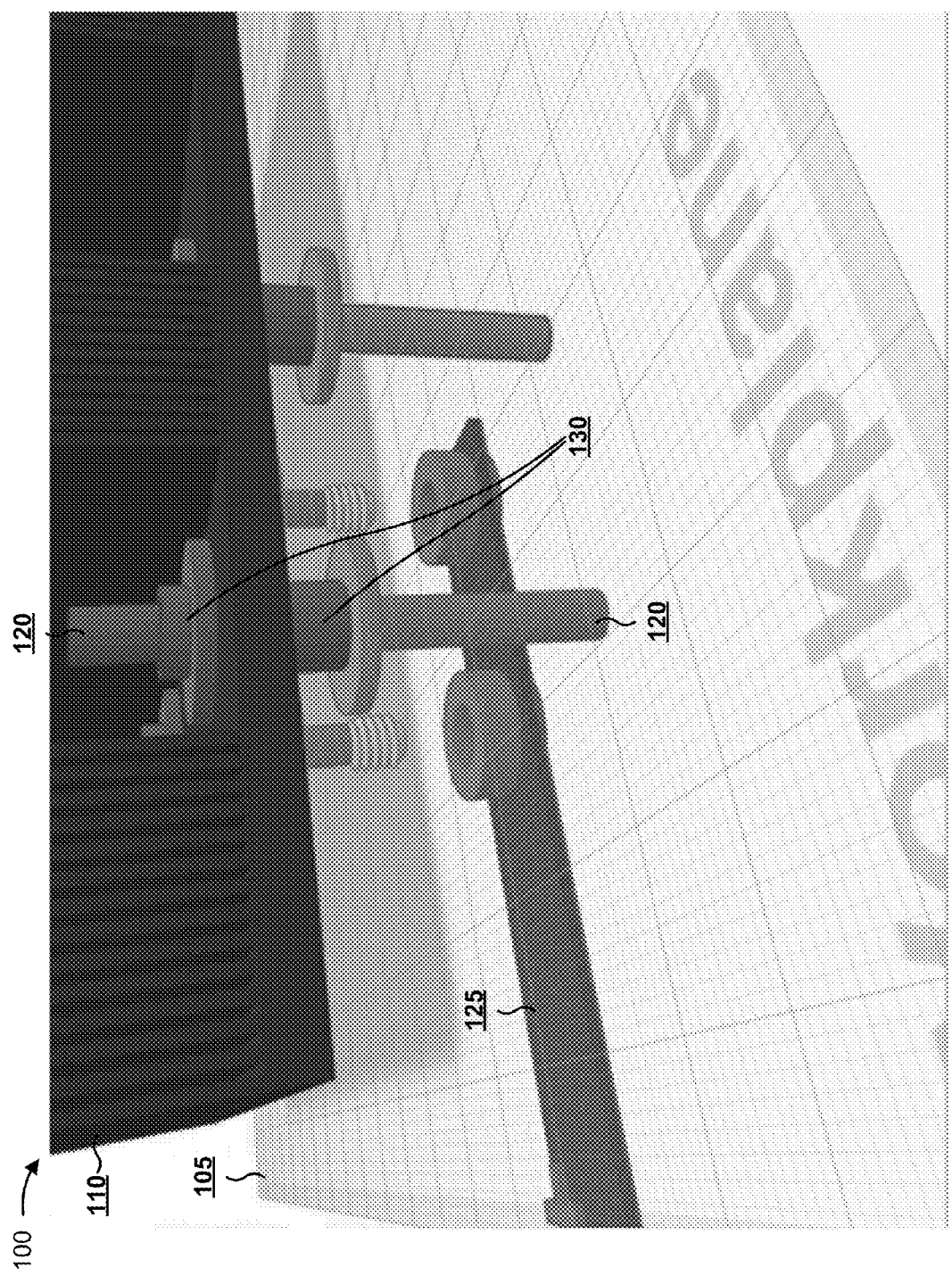
Figure 5:
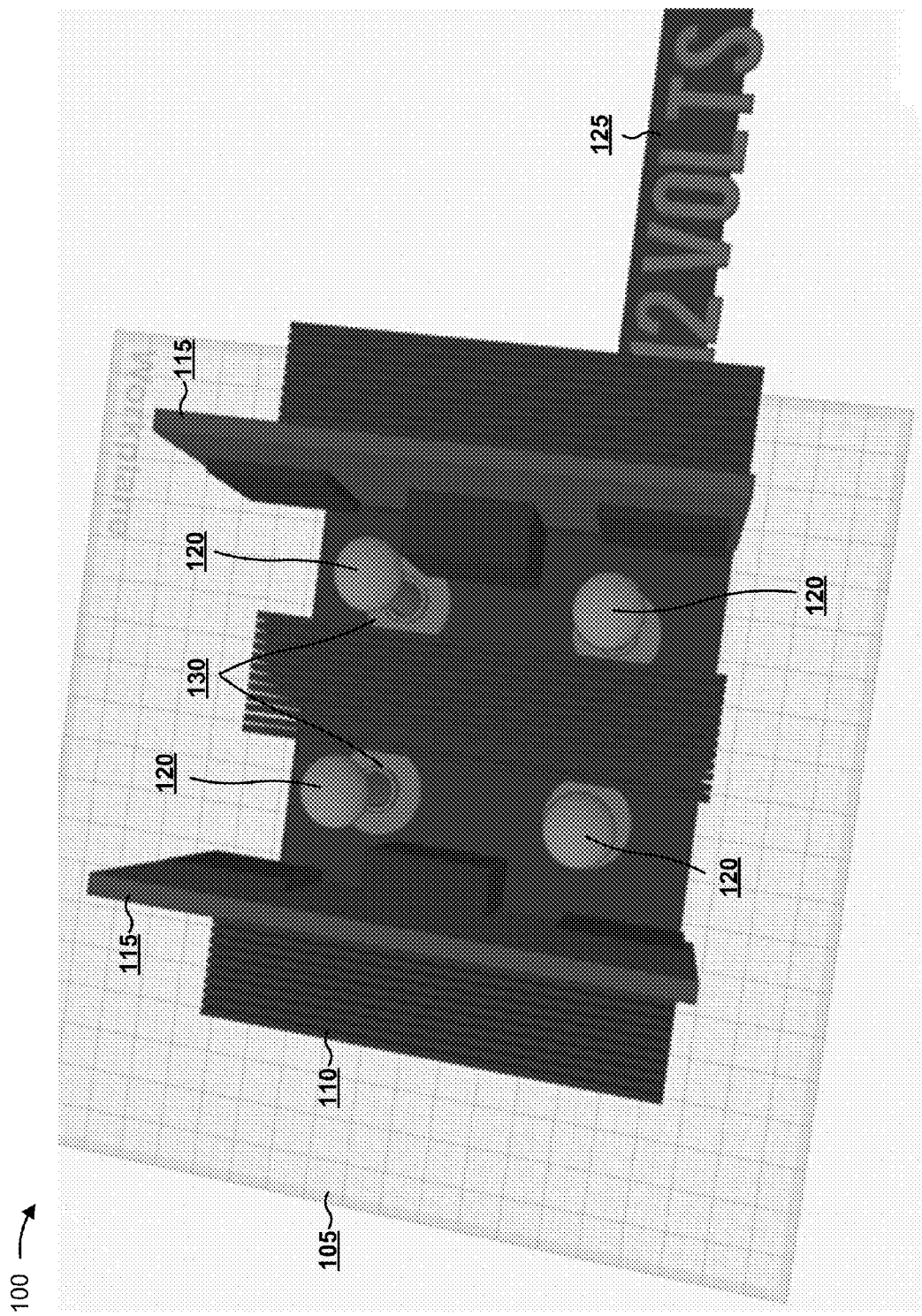

FIG. 1 is a diagram of an example apparatus 100 that includes a heat sink with a mounted power supply. As shown in FIG. 1, apparatus 100 may include a PCB 105, a heat sink 110, one or more power supplies 115, one or more conductive fasteners 120, a busbar 125, and a grounding element 130. As further shown, heat sink 110 may include a base 135, one or more fin areas 140, and one or more fin-free areas 145.

PCB 105 may include a substrate (e.g., a non-conductive substrate) that includes mechanical support for electronic components. Additionally, or alternatively, PCB 105 may include electrical connections for the electronic components using, for example, conductive tracks, pads, and/or other features etched from laminated sheets (e.g., copper sheets). PCB 105 may be single sided (e.g., one copper layer), double sided (e.g., two copper layers) or multi-layer (outer and inner layers). For a multi-layer PCB 105, conductors on different layers may be connected with vias.

Heat sink 110 may include a passive heat exchanger that transfers the heat generated by an electronic or a mechanical device to a fluid medium (e.g., air, a liquid coolant, etc.). Heat sink 110 may include fins that dissipate heat from an attached device to the surrounding air. Heat sink 110 may include pinned, straight finned, and/or flared types of fins. Heat sink 110 (e.g., a base of heat sink 110, fins of heat sink 110, etc.) may be composed copper, aluminum, or another type of material with a relatively high thermal conductivity as compared to other materials.

Power supply 115 may include a device that receives input power, regulates the input power, and supplies output power to one or more components of PCB 105 (e.g., one or more electrical components). Power supply 115 may include a combination of one or more controllers, field-effect transistors (FETs), regulators, inductors, capacitors, clocks, or the like. For example, power supply 115 may include a voltage converter to convert input power voltage (e.g., a first voltage) to output power voltage (e.g., a second voltage). Additionally, or alternatively, power supply 115 may include a voltage regulator to maintain a constant voltage (e.g., supplied to one or more components of PCB 105).

Conductive fastener 120 may fasten or attach heat sink 110 to PCB 105. For example, conductive fastener 120 may include a bolt, a screw, a stake, a pin, a rod, or the like. In some implementations, conductive fastener 120 may include metal, a metallic material, or another type of conductive material capable of carrying electrical energy. Additionally, or alternatively, conductive fastener 120 may fasten power supply 115 to heat sink 110. In some implementations, input power may be provided to power supply 115 via conductive fastener 120. Additionally, or alternatively, output power may be provided from power supply 115 to one or more components of PCB 105 via conductive fastener 120. For example, input power may be received by power supply 115 via a first conductive fastener 120 (e.g., at a first voltage), and output power may be supplied from power supply 115 to the one or more components via a second conductive fastener 120 (e.g., at a second voltage).

Busbar 125 may include a conductive bar (e.g., a transmission line, a metallic strip, a metallic bar, etc.). Busbar 125 may include copper, brass, aluminum, and/or another conductive material. As described elsewhere herein, busbar 125 may transmit an input voltage to power supply 115 (e.g., via conductive fastener 120).

Grounding element 130 may provide electrical grounding (e.g., a ground connection for power) for a power circuit created by the input power, power supply 115, the output power, and one or more electrical components of PCB 105. For example, grounding element 130 may include a grounded sheath, a nylon insulator, a nylon spacer, etc. In some implementations, grounding element 130 may include a substantially annular material disposed on a distal end of conductive fastener 120.

As shown in FIG. 1, apparatus 100 may include a heat sink 110 configured to be mounted to PCB 105. As used herein, mounting of heat sink 110 to PCB 105 may refer to a mounting of heat sink 110 to PCB 105 and/or a mounting of heat sink 110 to a component mounted on PCB 105. Heat sink 110 may further be configured for mounting of one or more power supplies 115 on heat sink 110. For example, power supply 115 may be mounted to heat sink 110 and/or a conductive fastener 120 of heat sink 110 via a push connector, corresponding male and female connectors, or the like. Heat sink 110 may be a dual purpose structure that operates as a heat sink and as a mounting structure for one or more power supplies 115.

In some implementations, power supply 115 may have a height that is approximately equal to the height of one or more fins of heat sink 110, so as not to significantly increase the profile of heat sink 110 combined with power supply 115 (e.g., to assist with air flow). Similarly, heat sink 110 (e.g., an outer surface of heat sink 110) may have a particular size or shape, and mounting power supply 115 to heat sink 110 may not significantly modify (e.g., increase) the size or shape of heat sink 110. In some implementations, the dimensions of power supply 115 may be contained within the dimensions of heat sink 110 (e.g., power supply 115 may not extend beyond an outer surface of heat sink 110).

As further shown in FIG. 1, heat sink 110 may include a base 135 that includes one or more fin areas 140 and one or more fin-free areas 145. A fin area 140 may include a surface area of base 135 that includes one or more fins, extending from base 135, used to dissipate heat. A fin-free area 145 may include a surface area of base 135 that does not include any fins. In some implementations, power supply 115 may be mounted on a fin-free area 145 of heat sink 110. For example, power supply 115 and heat sink 110 may include corresponding connectors (e.g., that connect power supply 115 to an input power source via conductive fastener 120), and power supply 115 may be mounted to heat sink 110 using the connectors. While FIG. 1 shows a heat sink 110 configured for mounting of two power supplies 115, in some implementations, heat sink 110 may be configured for mounting of a different quantity of power supplies 115, such as one power supply 115, three power supplies 115, four power supplies 115, etc.

As further shown in FIG. 1, heat sink 110 may be mounted to PCB 105 using one or more conductive fasteners 120. While FIG. 1 shows a heat sink 110 configured to be mounted to PCB 105 using four conductive fasteners 120, in some implementations, heat sink 110 may be configured to be mounted to PCB 105 using a different quantity of conductive fasteners 120, such as two conductive fasteners 120, three conductive fasteners 120, or the like. Heat sink 110 may include a quantity of mounting holes through which a corresponding quantity of conductive fasteners 120 may extend to mount heat sink 110 to PCB 105.

Power supply 115 may receive input power via a first conductive fastener 120, and may supply output power to one or more components of PCB 105 via a second conductive fastener 120. In some implementations, power supply 115 may convert the input power, such as by converting an input voltage of the input power (e.g., 12 volts, 24 volts, etc.) to an output voltage of the output power (e.g., an output voltage or output voltages required by one or more components on PCB 105, such as 3 volts, 1 volt, 0.9 volts, etc.). Additionally, or alternatively, power supply 115 may regulate the input power, such as by regulating an output voltage of the output power supplied to the one or more components of PCB 105. In some implementations, power supply 115 may include a connector (e.g., an electrical connector, such as a pin connector, a socket connector, a lead, or the like) configured to mate with a corresponding connector of conductive fastener 120 (e.g., to receive the input power, supply the output power, and/or connect with ground).

In some implementations, heat sink 110 may be configured to be mounted to PCB 105 using a quantity of conductive fasteners 120 corresponding to a quantity of power supplies 115 that heat sink 110 is configured to mount. For example, in some implementations, each power supply 115 mounted to heat sink 110 may be connected to two separate conductive fasteners 120 (e.g., one for receiving input power and one for supplying output power). For example, as shown in FIG. 1, heat sink 110 may be configured for mounting two power supplies 115, and may be configured with four holes for four conductive fasteners 120.

As another example, each power supply 115 may be connected to a separate conductive fastener 120 for supplying output power, but may receive input power via a same conductive fastener 120. For example, a heat sink 110 configured with four holes for four conductive fasteners 120 may be configured to mount three power supplies 115, in some implementations. In this case, each of the three power supplies 115 may supply output power via a different conductive fastener 120, and may receive input power via the same conductive fastener 120. In some implementations, each conductive fastener 120 may carry power to a different component of PCB 105. In some implementations, multiple conductive fasteners 120 may carry power to the same component of PCB 105.

As further shown in FIG. 1, power supply 115 may be configured to receive input power via busbar 125, in some implementations. For example, busbar 125 may be mounted to PCB 105 (e.g., to an opposite side of PCB 105 as compared to a side on which heat sink 110 is mounted). While busbar 125 is shown as supplying input power via two conductive fasteners 120, in some implementations, busbar 125 may supply input power via a different quantity of conductive fasteners 120, such as one conductive fastener 120. Although not shown, in some implementations, power supply 115 may be configured to receive input power via a power layer of PCB 105. For example, the power layer may be positioned below a component layer on which components of PCB 105, such as heat sink 110 or corresponding electrical components cooled by heat sink 110, are placed.

As further shown in FIG. 1, grounding element 130 may be positioned between a surface of conductive fastener 120 and a surface of heat sink 110 (e.g., to prevent or reduce charge buildup, static discharge, electromagnetic interference, etc.). In some implementations, grounding element 130 may extend to and/or make contact with (e.g., via soldering, bolting, pressing using a spring, etc.) one or more grounded components (e.g., one or more grounded vias) positioned on PCB 105, busbar 125, or the like. Additionally, or alternatively, grounding element 130 may extend through PCB 105.

Although not shown, power supply 115 may include a controller that receives one or more control signals from one or more control components of PCB 105. A control signal may include, for example, a clock signal, an inter-integrated circuit ($I^2C$) signal, an enable (En) signal, a voltage sense signal (e.g., to test the output voltage at a component that receives the output voltage), or the like. The controller may receive and/or transmit control signals via a wired connection (e.g., a flex connector), which may pass through a hole in heat sink 110. In some implementations, the wired connection may pass through the same hole as conductive fastener 120. The wired connection may connect power supply 115 to a control component of PCB 105.

As indicated above, FIG. 1 is provided merely as an example. Other examples are possible and may differ from what was described with regard to FIG. 1.

FIGS. 2-5 show apparatus 100 from different vantage points. Apparatus 100, as shown in FIGS. 1-5, is provided merely as an example. Other examples are possible and may differ from what is shown in FIGS. 1-5. For example, the number, arrangement, shape, and dimensions of components shown in FIGS. 1-5 are provided as an example. In practice, apparatus 100 may include additional components, fewer components, different components, differently arranged components, differently shaped components, or components of different dimensions than those shown in FIGS. 1-5.

Implementations described herein include a power supply mounted to a heat sink (e.g., on top of a base of the heat sink). These implementations increase the space available on a PCB because power supplies that would otherwise be mounted directly on the PCB may be mounted to the heat sink. Further, these implementations may reduce complexity of PCB design because the surface of the PCB may no longer need to be designed to accommodate power supplies. Further, providing a power supply on top of a base of the heat sink may provide a more direct route from the power supply to components located directly below the heat sinks, thereby further increasing PCB space and reducing complexity. Also, more accurate voltage can be provided to components due to nearby proximity of power supply and the components.

The foregoing disclosure provides illustration and description, but is not intended to be exhaustive or to limit the implementations to the precise form disclosed. Modifications and variations are possible in light of the above disclosure or may be acquired from practice of the implementations.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. An apparatus, comprising:
   a heat sink directly mounted to a printed circuit board or a component of the printed circuit board using a conductive fastener; and
   a power supply, mounted to the heat sink, to:
      receive input power via the conductive fastener, and
      supply output power to one or more components of the printed circuit board.

2. The apparatus of claim 1, wherein the conductive fastener is a first conductive fastener;
   wherein the heat sink is directly mounted to the printed circuit board or the component of the printed circuit board using a second conductive fastener; and
   wherein the power supply is to supply the output power to the one or more components of the printed circuit board via the second conductive fastener.

3. The apparatus of claim 1, further comprising
   a grounding element positioned between a surface of the conductive fastener and a surface of the heat sink.

4. The apparatus of claim 3, wherein the grounding element extends through the printed circuit board.

5. The apparatus of claim 3, wherein the grounding element extends to one or more grounded components positioned on the printed circuit board.

6. The apparatus of claim 1, wherein the power supply is to receive the input power via a busbar mounted to the printed circuit board.

7. The apparatus of claim 1, wherein the power supply is to receive the input power via a power layer of the printed circuit board.

8. The apparatus of claim 1, wherein the power supply is to convert an input voltage of the input power to an output voltage of the output power.

9. The apparatus of claim 1, wherein the power supply includes a connector to connect the power supply to the conductive fastener used to mount the heat sink to the printed circuit board or the component of the printed circuit board.

10. The apparatus of claim 1, wherein the power supply comprises a controller that receives one or more control signals from one or more control components of the printed circuit board.

11. A heat sink comprising:
a fin area that includes one or more fins to dissipate heat; and
a fin-free area,
   a power supply being mounted to the fin-free area, the heat sink being directly mounted to a printed circuit board or a component of the printed circuit board using a plurality of conductive fasteners,
   the power supply to receive input power via a first conductive fastener of the plurality of conductive fasteners, and
   the power supply to supply output power, to one or more components of the printed circuit board, via a second conductive fastener of the plurality of conductive fasteners.

12. The heat sink of claim 11, further comprising:
a first grounding element positioned between a surface of the first conductive fastener and a surface of the heat sink; and
a second grounding element positioned between a surface of the second conductive fastener and the surface of the heat sink.

13. The heat sink of claim 12, wherein at least one of the first grounding element or the second grounding element passes through the printed circuit board.

14. The heat sink of claim 12, wherein at least one of the first grounding element or the second grounding element is to make contact with one or more grounded components positioned on the printed circuit board.

15. The heat sink of claim 11, wherein the power supply comprises a controller that receives one or more control signals from one or more control components of the printed circuit board.

16. A device, comprising:
a heat sink directly mounted to a printed circuit board via each of a first conductive fastener and a second conductive fastener; and
a power supply, mounted to the heat sink, to receive input power via the first conductive fastener and supply output power via the second conductive fastener.

17. The device of claim 16, wherein the power supply is to supply the output power to one or more components of the printed circuit board.

18. The device of claim 16, wherein the power supply is a first power supply and the output power is first output power; and
wherein the device further comprises:
   the heat sink being mounted to the printed circuit board using a third conductive fastener; and
   a second power supply, mounted to the heat sink, to supply second output power via the third conductive fastener.

19. The device of claim 18, wherein the second power supply is to receive the input power via the first conductive fastener.

20. The device of claim 18, further comprising:
the heat sink being mounted to the printed circuit board using a fourth conductive fastener,
wherein the second power supply is to receive the input power via the fourth conductive fastener.

* * * * *